United States Patent
Chen et al.

(10) Patent No.: US 6,323,034 B1
(45) Date of Patent: Nov. 27, 2001

(54) AMORPHOUS TFT PROCESS

(75) Inventors: Yeong-E Chen, Baushan Shiang; Jr-Hong Chen, Hsin-Chu; Ya-Hsiang Tai, Taipei, all of (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/373,250

(22) Filed: Aug. 12, 1999

(51) Int. Cl.$^7$ .................................................. H01L 21/00
(52) U.S. Cl. ................... 436/30; 438/149; 257/57
(58) Field of Search ............ 438/30, 149, 158–162, 438/166, 586, 670; 257/52, 57, 61, 72–75, 352–354, 408

(56) References Cited

U.S. PATENT DOCUMENTS

| | | | |
|---|---|---|---|
| 5,371,398 | * 12/1994 | Niashihara | 257/435 |
| 5,416,340 | 5/1995 | Yoshida et al. | 257/59 |
| 5,552,630 | 9/1996 | Miyaka | 257/435 |
| 5,652,159 | 7/1997 | Hirano . | |
| 5,757,028 | * 5/1998 | Sasaki et al. | 257/57 |

* cited by examiner

Primary Examiner—David Nelms
Assistant Examiner—Dung A Le
(74) Attorney, Agent, or Firm—George O. Saile; Stephen B. Ackerman

(57) ABSTRACT

A thin film transistor design is described which is not subject to either dark or photo current leakage. The process to manufacture this device begins with the formation of a gate electrode on a transparent substrate followed by its over coating with layers of gate insulation, undoped amorphous silicon, doped amorphous silicon, and a second layer of chromium. The chromium and amorphous silicon layers are then patterned and etched to form a channel pedestal. In a key feature of the invention the vertical side walls of this pedestal are then given a protective coating of oxide or nitride, forming spacers. This is then followed by the deposition of second level metal which is etched to form source and drain electrodes with a suitable gap between them.

9 Claims, 4 Drawing Sheets

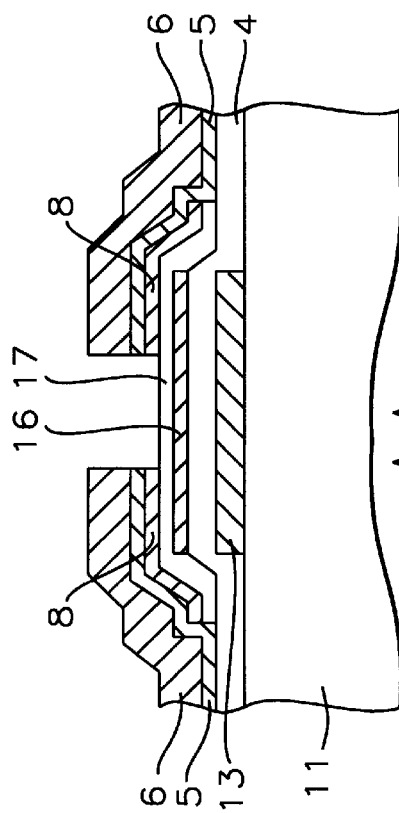
FIG. 1a – Prior Art
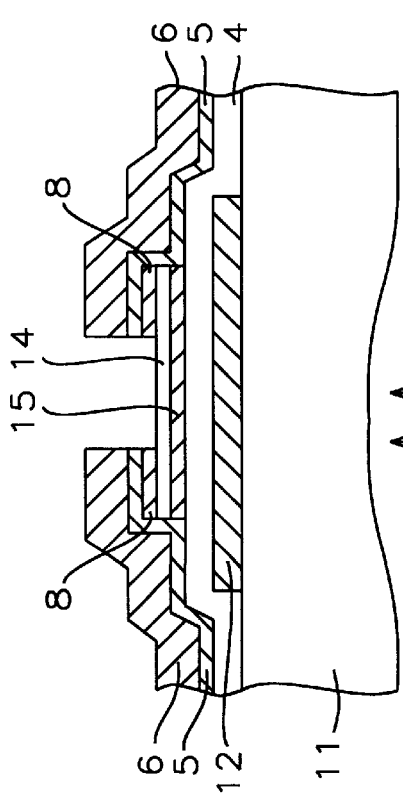
FIG. 1b – Prior Art
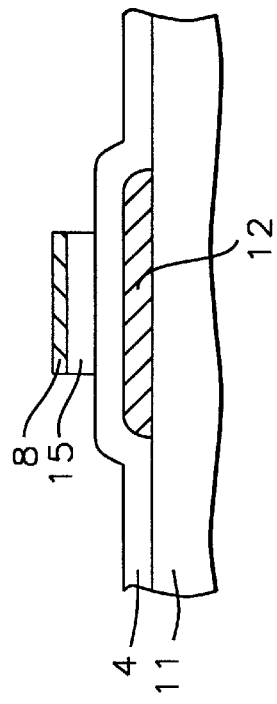
FIG. 2 – Prior Art
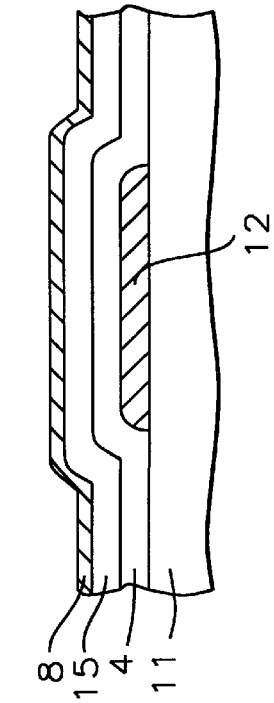
FIG. 3 – Prior Art

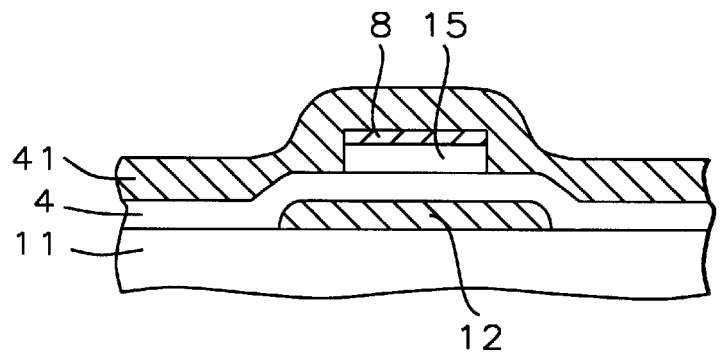
FIG. 4 – Prior Art
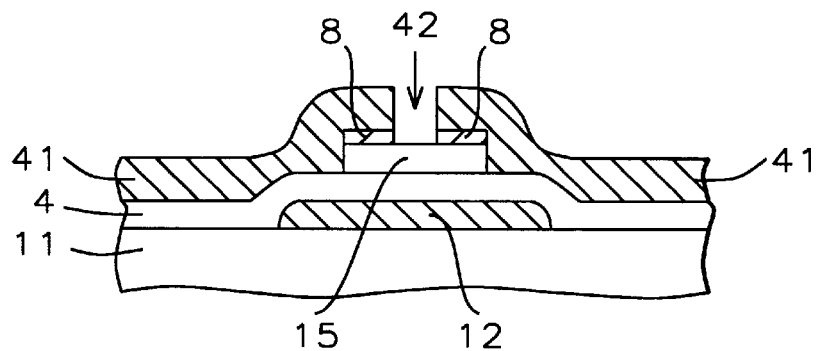
FIG. 5 – Prior Art
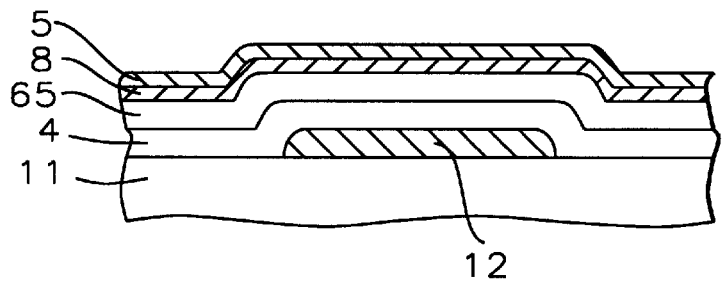
FIG. 6
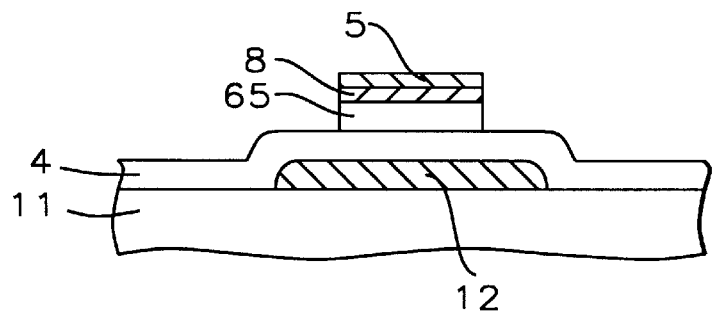
FIG. 7a

AMORPHOUS TFT PROCESS

FIELD OF THE INVENTION

The invention relates to the general field of thin film transistor s with particular reference to structures having low photo (leakage) current as well as low dark (hole) current.

BACKGROUND OF THE INVENTION

Thin film transistors are commonly used in Liquid Crystal Displays (LCDs). In general, liquid crystal displays depend on the overlap of two lines (scan and data lines), each carrying approximately half the voltage needed to activate a single pixel of the LCD. In the active matrix version of an LCD, a thin film transistor (TFT) is placed across each of the intersections of the scan and data lines thereby sharpening the cutoff point and enabling a brighter display to be used. Transistors, in general, are well known to be light sensitive, in common with all semiconductors, so that care must be taken to ensure that light used to illuminate the display does not interfere with the behavior of the TFT. A number of schemes exist for accomplishing this. In particular, the gate electrode of the TFT is located between the light source and the semiconducting channel of the device. This scheme, as currently implemented in the prior art, is not fully effective as we now discuss.

In FIGS. 1a and 1b we illustrate two examples of thin film transistors typical of the prior art. Referring first to FIG. 1a, we see a transparent insulating substrate 11 on which a gate electrode 12, typically of chromium, has been formed. This is covered by layer of gate insulation 4, typically of silicon nitride or silicon oxide. Layers 14 and 15 represent parts of a single layer of undoped amorphous silicon, the difference between them to be explained shortly. Contact is made to layer 14/15 through N+ doped amorphous silicon contacts 8. Leads to these contacts are in the form of chromium layer 5 which, in turn, has been over coated with source and drain electrodes 6, with a suitable gap left between them.

Considering first FIG. 1a, with the application of a positive voltage to gate electrode 12, electrons are attracted to the interface between the amorphous silicon 14/15 and the gate insulation layer 4, thereby forming an enhancement layer (conductive channel) which we have marked as layer 14. As the voltage at 12 is increased so does the thickness of 14 grow until layer 15 disappears and layer 14 makes contact with N+ contacts 8 and, in principle, the device then switches on.

As can be seen, the width of gate electrode 12 is sufficient so that all light 2 from the display is blocked from reaching layer 14/15. However, it can also be seen that, in this design, layer 14 extends all the way to the vertical portions of chromium layer 5 so that some conduction through the channel (i.e. dark current) will begin at low gate voltages long before the intended switch-on voltage has been reached.

The dark current problem has been effectively eliminated in the design shown in FIG. 1b. Although the amorphous silicon channel 16/17 extends all the way to chromium contact layer 5, the conductive portion 16 is limited to the area directly above gate electrode 13. However, this has been achieved at the cost of not fully blocking light 2 from reaching the channel so this design is subject to significant photo current.

Thus, TFT designs currently available in the prior art must make a compromise between achieving low dark current or low photo current. The present invention discloses a design in which both can be achieved in the same device. Since part of the present invention is a process for manufacturing this device, it is instructive to first review how devices of the type illustrated in FIGS. 1a and 1b are currently manufactured.

Referring now to FIG. 2, the prior art process begins with transparent substrate 11 onto whose surface a layer of chromium is deposited and then patterned to form gate electrode 12 (seen in cross-section). This is followed by gate insulation 4, amorphous silicon layer 15, and doped amorphous silicon layer 8.

As shown in FIG. 3, a channel pedestal is then fashioned out of layers 8 and 15. This is followed by the deposition of second level metal layer 41 as shown in FIG. 4, the final step being the etching of 41 and 8 down to the level of 15, to form gap 42 as shown in FIG. 5.

A routine search of the prior art did not uncover any references that disclose either the structure or the process of the present invention. Several of the references that were found were, however, considered to be of interest. For example, Nishihara (U.S. Pat. No. 5,371,398) describes a typical prior art TFT design but adds a light protecting layer over the far side of the exposed portion of the channel. This prevents light from reaching the channel from either direction.

Yoshida et al. (U.S. Pat. No. 5,416,340) insert an insulating layer between the N+ ohmic contacting layer and the amorphous silicon. This has the effect of covering a short length of the amorphous silicon near the source and drain, without actually touching it. Hole-electron pairs that form as a result of light falling on the main (uncovered) portions recombine before they reach the source or the drain.

Miyake (U.S. Pat. No. 5,552,630) describes a device that is very close to that of Yoshida et al.

Hirano (U.S. Pat. No. 5,652,159) teaches a process for forming a TFT having a lightly doped drain structure.

SUMMARY OF THE INVENTION

It has been an object of the present invention to provide a novel structure for a thin film transistor along with a process for its manufacture.

Another object of the invention has been that said structure be insensitive to leakage currents associated with illumination from above as well as exhibiting low hole (dark) current.

These objects have been achieved by means of a process which begins in the normal way with the formation of a gate electrode on a transparent substrate followed by its over coating with layers of gate insulation, undoped amorphous silicon, doped amorphous silicon, and a second layer of chromium. The chromium and amorphous silicon layers are then patterned and etched to form a channel pedestal. In a key feature of the invention the vertical side walls of this pedestal are then given a protective coating of oxide or nitride, forming spacers. This is then followed by the deposition of second level metal which is etched to form source and drain electrodes with a suitable gap between them.

BRIEF DESCRIPTION OF THE DRAWINGS

FIGS. 1a and 1b are cross-sectional views of two TFT implementations according to the prior art.

FIGS. 2 to 5 summarize the process of the prior art used to make a thin film transistor.

FIG. 6 illustrates the starting point for the manufacture of a thin film transistor according to the process of the present invention.

FIGS. 7a and 7b illustrate two alternative ways for forming the channel pedestal that is a key feature of the present invention.

DESCRIPTION OF THE PREFERRED EMBODIMENTS

Figure 7B:
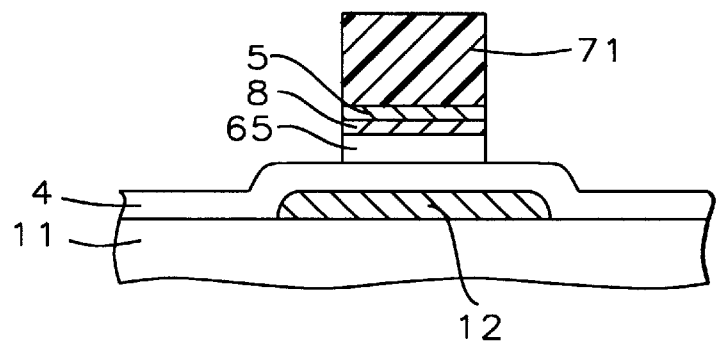

We will describe the present invention in terms of the process used for its manufacture. In the course of this description the structure of the invention will become apparent.

Referring now to FIG. 6, the process of the present invention begins with the provision of transparent insulating substrate 11 onto which is deposited a chromium layer to a thickness between about 0.1 and 0.4 microns. Although chromium is preferred, other metals such as aluminum, molybdenum, and molybdenum tungstide could also have been used. This is patterned and etched to form gate electrode 12 which has a width between about 3 and 20 microns.

This is followed by the deposition of gate insulation layer 4 which has a thickness between about 0.2 and 0.4 microns and is made of silicon oxide or silicon nitride. Next, a layer of undoped amorphous silicon 65 is deposited to a thickness between about 0.05 and 0.3 microns by means of plasma enhanced chemical vapor deposition (PECVD). This is followed by layer 8 of N+ amorphous silicon which is deposited to a thickness between about 0.01 and 0.1 microns by means of PECVD. Next a second chromium layer 5 is laid down.

Using standard photolithographic techniques, layers 5, 8, and 65 are then etched, down to the level of gate insulation 4 to form a channel pedestal. This channel pedestal is located above and inside the gate electrode 12 and has a width between about 1 and 18 microns.

Figure 8A:
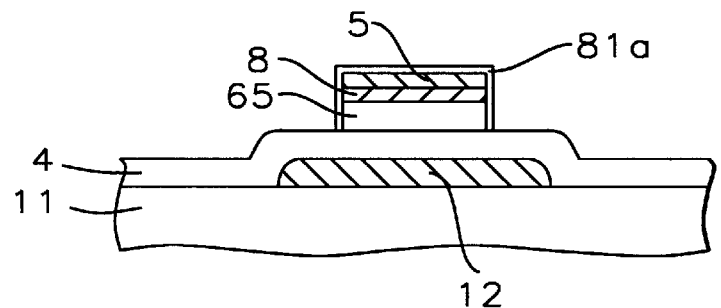
FIGS. 8a and 8b are subsequent stages derived from FIGS. 7a and 7b respectively.

At this stage of the main process two alternative subprocesses may be used, providing two different embodiments of the invention:

The first subprocess can be seen in FIGS. 7a and 8a. In FIG. 7a the photoresist can be seen to have been removed from over chromium layer 5. Then, as shown in FIG. 8a, insulating layer 81a is grown over all exposed portions of the channel pedestal. Layer 81a may be formed either through nitridation or oxidation and is typically between about 10 and 200 Angstroms thick. Nitridation was achieved using plasma nitridation while oxidation took the form of thermal oxidation or plasma oxidation.

The horizontal portion of layer 81a (comprising chromium nitride/oxide as well as some unreacted chromium) was then selectively removed. Layer 5 remains in place at this point for optional removal later.

Figure 8B:
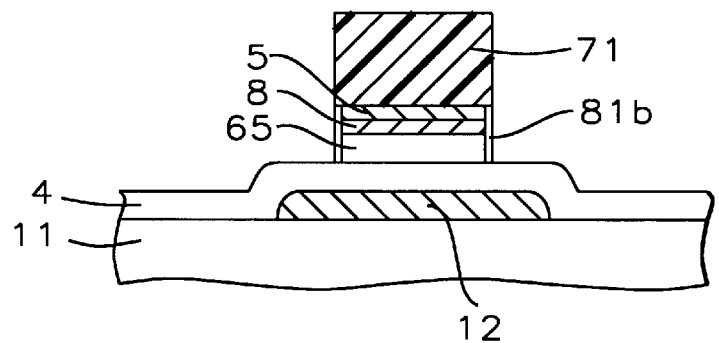

The second, alternative, subprocess is illustrated in FIGS. 7b and 8b. In FIG. 7b photoresist mask 71 can be seen to have been left in place over chromium layer 5. Then, as shown in FIG. 8b, insulating layer 81b is grown over all exposed portions of the channel pedestal. Layer 81b may be formed either through nitridation or oxidation and is typically between about 10 and 200 Angstroms thick. Nitridation was achieved using plasma nitridation while oxidation took the form of plasma oxidation At this point the photoresist was removed, thereby exposing chromium layer 5 which was then etched away or, optionally, left in place.

Figure 9:
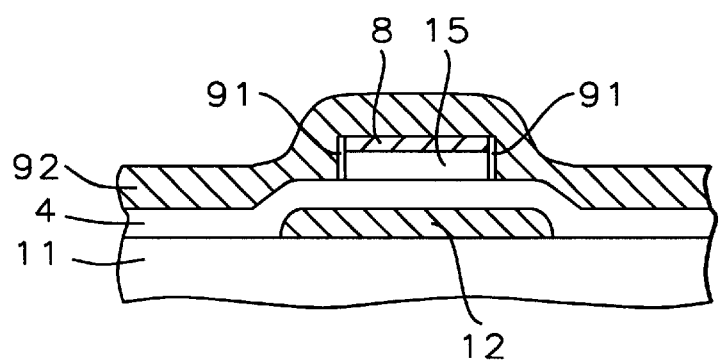
FIG. 9 shows the structure of the present invention following the deposition of a layer of second level metal.

The two alternate subprocess now reconverge to a single main process whose next step is the deposition of a layer of second level metal 92, as shown in FIG. 9. Layer 92 is made up of aluminum, molybdenum, copper, chromium, or molybdenum tungstide and is typically between about 0.3 and 1 microns thick. Note that following the removal or retention of chromium layer 5 (in either embodiment) what is left are spacers 91 (FIG. 9) which isolate layer 92 from the edges of channel 15, effectively eliminating any possible dark current, as can occur in devices of the prior art.

Figure 10:
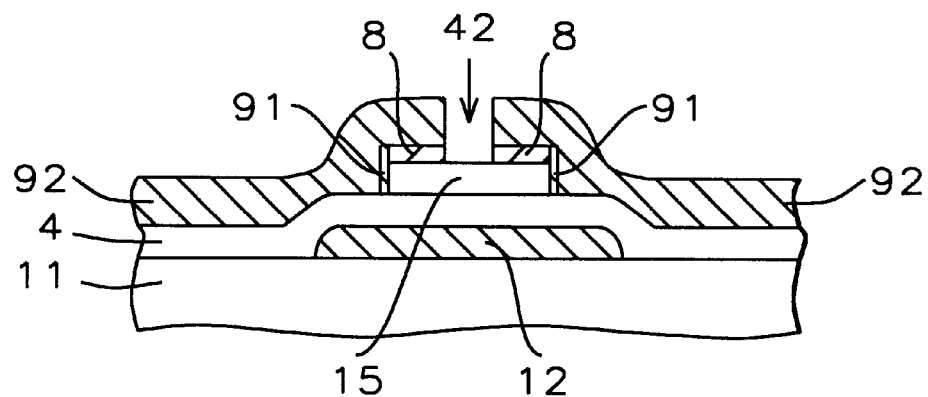
FIG. 10 is a cross-sectional view of the completed structure taught by the present invention.

The final step of the process of the present invention is the formation of gap 42 (between about 0.5 and 15 microns wide) in layers 8 and 92, usually, though not necessarily, centrally located above amorphous silicon channel 15, as illustrated in FIG. 10. Since only a single mask is needed to etch this gap, layers 8 and 92 are in perfect alignment. Note that since channel 15 is narrower than gate electrode 12 it is shielded from light coming from the underside of substrate 11, effectively eliminating any possible photo current, as can occur in devices of the prior art.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a thin film transistor, comprising:

(a) providing a transparent insulating substrate and depositing thereon a first layer of chromium;

(b) patterning and etching said first layer of chromium to form a gate electrode having a width;

(c) depositing a layer of gate insulation over said gate electrode and the substrate;

(d) depositing a layer of undoped amorphous silicon over said layer of gate insulation;

(e) depositing a layer of N+ amorphous silicon over said layer of undoped amorphous silicon, (f) depositing a second layer of chromium over said N+ layer of amorphous silicon;

(g) patterning and etching the second chromium layer, the N+ amorphous silicon layer, and the undoped amorphous silicon layer to form a channel pedestal having a width;

(h) forming insulating spacers on all vertical surfaces of said channel pedestal, steps (g) and (h) further comprising:
  forming the channel pedestal using a mask of photoresist,
  removing the photoresist;
  growing a dielectric layer on all exposed surfaces of the channel pedestal;
  selectively removing all exposed chromium compounds, and, optionally, removing all exposed chromium;

(i) depositing a layer of second level metal over the channel pedestal and the layer of gate insulation;

(j) patterning and etching said layer of second level metal to form source and drain electrodes, symmetrically disposed over said channel pedestal and separated from one another by a gap; and (k) using the source and drain electrodes as a mask, etching the N+ amorphous silicon layer down to the level of the undoped amorphous silicon layer.

2. The process of claim 1 wherein the step of growing a dielectric layer on all exposed surfaces further comprises thermal oxidation, plasma oxidation, or plasma nitridation of said surfaces.

3. The process of claim 1 wherein the width of the gate electrode is between about 3 and 20 microns.

4. The process of claim 1 wherein the width of the channel pedestal is between about 1 and 18 microns.

5. The process of claim 1 wherein the step of depositing a layer of undoped amorphous silicon further comprises use of PECVD.

6. The process of claim 1 wherein the layer of undoped amorphous silicon is deposited to a thickness between about 0.2 and 0.5 microns.

7. The process of claim 1 wherein the step of depositing a layer of N+ amorphous silicon further comprises using PECVD.

8. The process of claim 1 wherein the layer of N+ amorphous silicon is deposited to a thickness between about 0.05 and 0.3 microns.

9. The process of claim 1 wherein the layer of second level metal is selected from the group consisting of aluminum, molybdenum, copper, chromium, and molybdenum tungstide.

* * * * *